(12) United States Patent
Joshi et al.

(10) Patent No.: US 8,115,304 B1
(45) Date of Patent: Feb. 14, 2012

(54) METHOD OF IMPLEMENTING A DISCRETE ELEMENT IN AN INTEGRATED CIRCUIT

(75) Inventors: Mukul Joshi, Mountain View, CA (US); Venkatesan Murali, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 732 days.

(21) Appl. No.: 12/027,251

(22) Filed: Feb. 6, 2008

(51) Int. Cl.
*H01L 23/34* (2006.01)

(52) U.S. Cl. ............... 257/724; 257/E23.116; 257/704; 257/778; 438/107; 438/125

(58) Field of Classification Search ........... 257/E23.079, 257/E23.116, E23.124, E23.153, E23.154, 257/724, 499, 523, 528, 685, 704, 778; 438/108, 438/110, 111, 112, 124, 125, 127, 107
See application file for complete search history.

(56) References Cited

U.S. PATENT DOCUMENTS

| | | | | |
|---|---|---|---|---|
| 3,693,252 | A | | 9/1972 | Robertson et al. |
| 4,223,069 | A | | 9/1980 | Berghmans |
| 5,471,027 | A | * | 11/1995 | Call et al. ............ 219/85.13 |
| 5,847,951 | A | * | 12/1998 | Brown et al. ............ 363/147 |
| 6,259,155 | B1 | * | 7/2001 | Interrante et al. ............ 257/690 |
| 6,710,444 | B2 | * | 3/2004 | Xie et al. ............ 257/723 |
| 6,734,539 | B2 | * | 5/2004 | Degani et al. ............ 257/686 |
| 6,933,613 | B2 | * | 8/2005 | Akashi ............ 257/778 |
| 6,946,601 | B1 | * | 9/2005 | Lee et al. ............ 174/534 |
| 7,095,112 | B2 | * | 8/2006 | Endo et al. ............ 257/724 |
| 7,109,578 | B2 | * | 9/2006 | Ishida ............ 257/700 |
| 7,242,081 | B1 | * | 7/2007 | Lee ............ 257/686 |
| 7,342,298 | B1 | * | 3/2008 | Zhang ............ 257/667 |
| 7,569,918 | B2 | * | 8/2009 | Gerber et al. ............ 257/676 |
| 7,679,177 | B2 | * | 3/2010 | Jang ............ 257/686 |
| 7,772,046 | B2 | * | 8/2010 | Pagaila et al. ............ 438/127 |
| 7,791,192 | B1 | * | 9/2010 | Joshi et al. ............ 257/724 |
| 7,855,100 | B2 | * | 12/2010 | Shim et al. ............ 438/107 |
| 2004/0238934 | A1 | * | 12/2004 | Warner et al. ............ 257/686 |

OTHER PUBLICATIONS

U.S. Appl. No. 11/340,996, filed Jan. 27, 2006, Joshi et al., entitled "Circuit for and Method of Implementing a Capacitor in an Integrated Circuit", Xilinx, 2100 Logic Drive, San Jose, CA.

* cited by examiner

*Primary Examiner* — Chris Chu
(74) *Attorney, Agent, or Firm* — LeRoy D. Maunu; Thomas George

(57) ABSTRACT

A method of implementing a discrete component in an integrated circuit package is described. The method includes steps of coupling the discrete component to a surface of a substrate of the integrated circuit package, coupling an integrated circuit die to the surface of the substrate, applying a first epoxy material, and applying a second epoxy material to the discrete component, where the first epoxy material is different from the second epoxy material.

18 Claims, 3 Drawing Sheets

FIG. 3
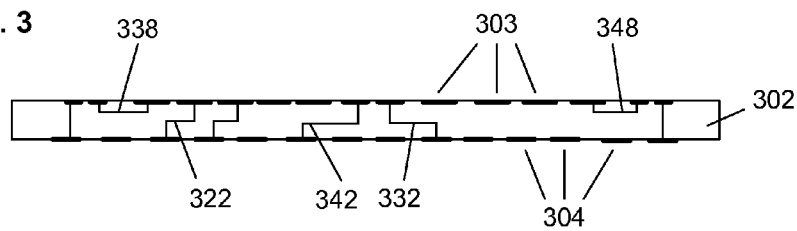
FIG. 3a
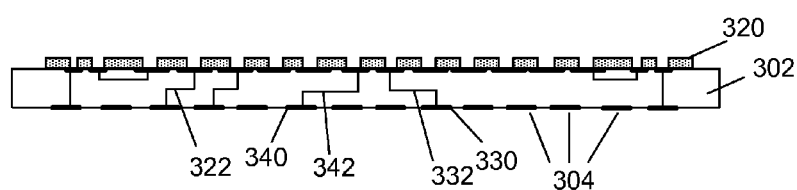
FIG. 3b
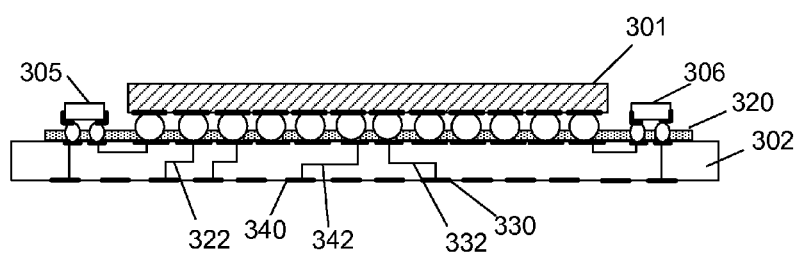
FIG. 3c
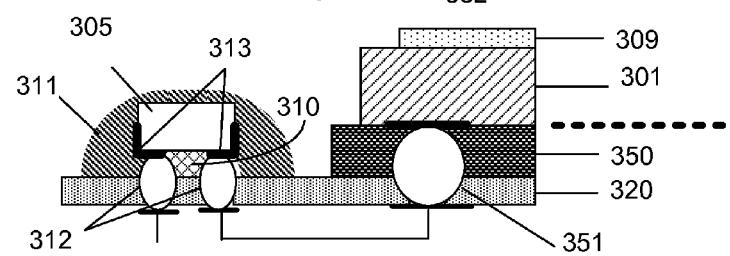
FIG. 3d
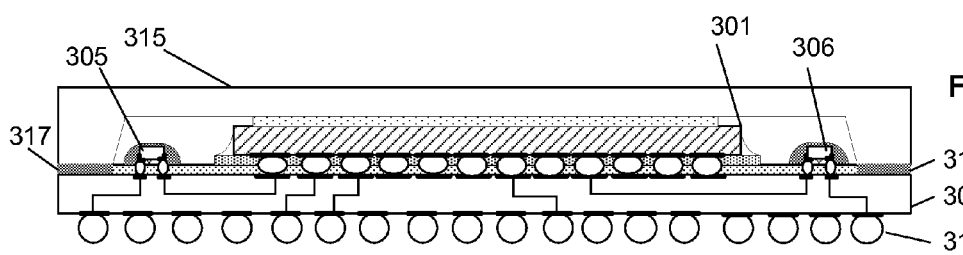
FIG. 3e

US 8,115,304 B1

METHOD OF IMPLEMENTING A DISCRETE ELEMENT IN AN INTEGRATED CIRCUIT

FIELD OF THE INVENTION

The present application relates generally to an integrated circuit, and in particular, to a method of implementing a discrete element in an integrated circuit package.

BACKGROUND OF THE INVENTION

As the integrated circuit (IC) technologies continue to evolve, packaging requirements will continue to pose challenges. For example, shrinking in process technology, design integration, such as system on a chip, power consumption, and higher pin density may challenge the package design on an IC. A ball grid array (BGA) is an advanced IC package that includes a substrate having conductive contact pads on the bottom for coupling an IC die with a printed circuit board (PCB). A wire bond BGA package includes an IC die having input/output (I/O) pads which are bonded to conductive contact pads on the surface of the substrate by way of wire bonds. In contrast, a flip chip BGA package includes an IC die having I/O pads which are directly bonded to the substrate using solder bumps. Unlike in a wire bond BGA package, the IC die having the solder bumps is flipped over and placed face down in a flip chip BGA package, with the solder bumps connecting directly to corresponding conductive contact pads on the top surface of the substrate. The contact pads on the bottom of the substrate of either type of package may be soldered to a PCB of a system.

Flip chip packages are particularly useful with ICs having a large number of pins, such as programmable logic devices (PLDs). A PLD is an IC designed to be programmed or configured by a user so that the user may implement any design of their choice. One type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA.

However, as the density, complexity, and the amount of circuitry for a given IC continues to increase, the noise associated with such IC continues to increase. Also, such ICs are being utilized in many applications that require multiple I/O standards support, which may require additional passive components, such as capacitors and resistors to meet such standards. These requirements are a particular problem in a PLD due to the switching noise of digital circuits, high density of interconnect lines, and the high package pin count. For instance, in order for the circuit to operate properly, it is important to effectively control noise generated internally from digital switching. One way to control such noise is through the use of decoupling capacitors. In an example, the IC package 100 of FIG. 1 may include discrete elements, such as capacitors, 106 and 108 coupled to power terminals of the IC die 104. The discrete elements 106 and 108 may suppress noise coupled to the supply terminals due to switching logic.

In one example, the IC package 100 of FIG. 1 may include openings or relief openings 105 on the substrate. The relief openings 105 may be positioned in various locations on the substrate to improve the overall quality of the IC package. For instance, the openings may aid in the relief of stresses, such as environmental fluctuations including temperature changes due to the assembly process and the operation of the IC in a system. A disadvantage of having the relief openings 105 is the allowance of solutions, such as solvents and moisture, to penetrate the IC package during the assembly process of a system and/or normal operation of the IC. The presence of solutions may degrade the quality of the IC package, and therefore, the performance of the IC. For instance, the prolonged exposure to the solutions may corrode terminals of the components 106 and 108. The corroded terminals of the components may increase the contact resistance between the substrate and a terminal of the component, therefore, reducing the effectiveness of the component, and therefore, degrading performance of the IC. In other instances, the corrosion may sever the electrical connection (e.g., very high impedance) between the substrate and the terminal of the component. In such instances, the IC may fail to operate properly.

Therefore, there is a need for an improved method and implementation of discrete component on a substrate of an IC package, such as a discrete capacitor or resistor that meets performance and quality criteria of the IC design.

SUMMARY OF THE INVENTION

According to an embodiment of the present invention, an integrated circuit package including a substrate, a discrete component, an integrated circuit die, a first epoxy, and a second epoxy is described. The integrated circuit die and the discrete component are coupled to a surface of the substrate. The first epoxy material and the second epoxy material are applied to the discrete component, where the first epoxy material and the second epoxy material encase the discrete component.

According to another embodiment of the present invention, a method of implementing a discrete element in an integrated circuit package is described. The method include the steps of coupling a discrete element to a surface of a substrate of the integrated circuit package, coupling an integrated circuit die to the surface of the substrate, applying a first epoxy material to the discrete element, and applying a second epoxy material to the discrete element, where the first epoxy material and the second epoxy material encase the discrete element.

BRIEF DESCRIPTION OF THE DRAWINGS

FIGS. 3a-3e are series of figures showing steps of an assembly process of an integrated circuit package according to an embodiment of the present invention.

DETAILED DESCRIPTION OF THE DRAWINGS

Figure 1:
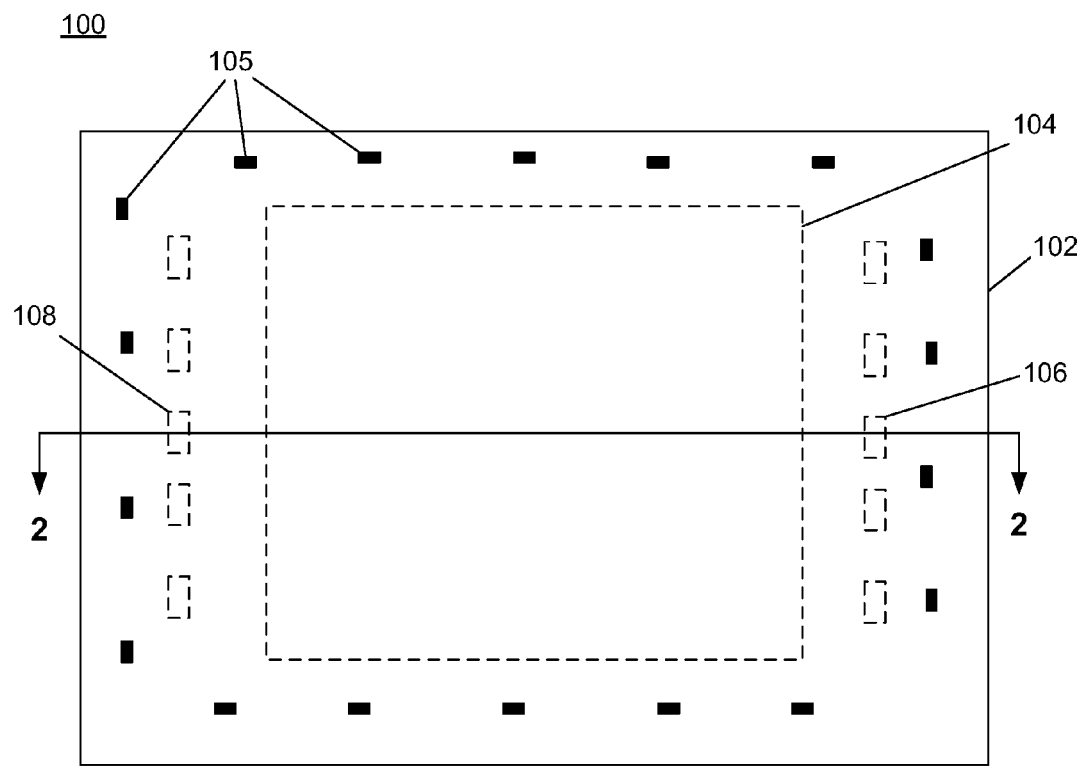
FIG. 1 is a top plan view of an integrated circuit package having an integrated circuit die and discrete elements coupled to a substrate.

As discussed above, FIG. 1 illustrates an IC package 100 of FIG. 1 including an integrated circuit (IC) die 104, discrete elements including elements 106 and 108, and a substrate 102. The discrete elements 106 and 108, which may be capacitors, are positioned on the substrate 102 in close proximity to the IC die 104. Other examples of discrete elements may include resistors, inductors, diodes, or transistors. Resistors, for example, may be used to terminate signals of the IC die, while transistors may be used to save printed circuit board (PCB) space. Capacitors, for example, may be utilized to provide a low impedance path to decouple noise of power supply terminals or to block direct current (DC) voltage from an analog signal. For instance, placing a capacitor in close proximity to the power and ground terminals of the IC die on a substrate may reduce RF (radio frequency) energy generated by rapid changes of current demand on the power supply during logic circuit switching, and then channel it to the ground return path. The use of decoupling capacitors is well known to persons skilled in the art and may be used to prevent power line channeled noise from degrading performance of the IC. Since uncontrolled power supply noise has many negative effects, such as intermodulation and crosstalk, it is therefore important to reduce noise, such as power supply noise on an IC, whenever possible.

Figure 2:
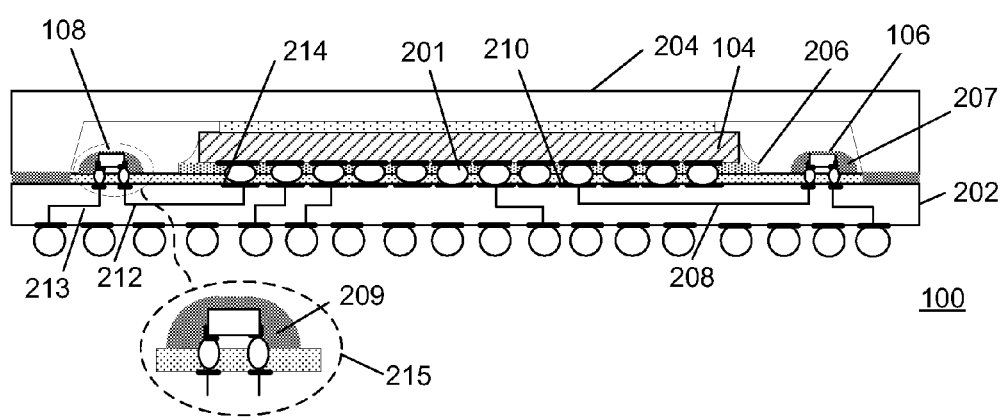
FIG. 2 is a cross-sectional view of the integrated circuit package of FIG. 1 taken at lines 2-2.

In an IC package, discrete components, such as capacitors and resistors, may be placed on periphery of the substrate, and as close to the IC die as possible to maximize the effectiveness of such components. In general, the close proximity described above may be needed to reduce inductance of the conductor wire used for coupling, thereby improving performance of the IC. FIG. 2 illustrates a cross section of the IC package 100 of FIG. 1. FIG. 2 illustrates connectivity and physical positioning of components 106 and 108 in the IC package 100 and relative to the IC die 104. For example, in the IC package 100 of FIG. 2, the IC die 104 including solder bumps 201 is positioned on a substrate 202, which is enclosed with a lid 204. The proximity of the components 106 and 108 to the integrated circuit die 104 is constrained in general by the die size and the underfill 206. The conducting metal lines 208, 212 and 213 in the substrate 202 connect the component terminals, terminals of the IC die 104, and package bumps/contacts 210, 214 via the substrate 202. In general, the inductance of metal lines coupling the components to the IC die is directly proportional to the length of the conductive path. Accordingly, having discrete components, such as capacitors 106 and 108, placed inside the IC package 100 and in close proximity to the IC die 104 may have low inductance, thereby improving the performance of the IC.

IC package 100 may be fabricated using known methods to encapsulate the IC die 104 and the components 106 and 108. For example, underfill 206, which may be an epoxy material, is applied to the IC die 104 to protect the solder bumps 201 from exposure to solvents and moisture. In another example, an epoxy material applied to the capacitors 106 and 108 partially protects terminals of the capacitors from exposure to solvents and moisture. The epoxy material 207 can be applied to the components 106 and 108 that may cover an exposed portion of the components, where the exposed portion of the components is the top side of the components and their terminals. In an example, component 108 of FIG. 2 may be a capacitor shown to have an epoxy material 209 applied to exposed top sides of the capacitor terminals (shown magnified in the dashed oval 215 of FIG. 2). As illustrated in FIG. 2, the underside and the inner portion of the terminals of component 108 may be exposed to solvents and moisture, in particular the area between the substrate and the bottom side of the component 108. In another example, a discrete component coupled to the substrate 202 may not have distinguishable sides (e.g., top, bottom, etc.), but in such instances, the exposed portions of terminals associated with such components regardless of the orientation and/or type of component may be a concern.

Other methods of encapsulating an IC die and discrete components coupled to a substrate of an IC package may include hermetically sealing the IC package, eliminating the possibility of exposing the IC die and the discrete components to solvents and moisture. However, there are disadvantages in utilizing such methods. For example, special package design and materials may be needed, the hermetically sealed IC package may have a poor thermal performance, and/or an increase in manufacturing cost may be prohibitive in manufacturing the IC package. Therefore, an alternative method as described in connection with FIGS. 3a-3e may maintain low cost and preserve the desired performance.

FIGS. 3a-3e show an example of an assembly process of an IC package according to an embodiment of the present invention. For instance, a substrate 302 is fabricated including a plurality of contacts 303 on a top surface, a plurality of contacts 304 on a bottom surface, and conductors according to substrate artwork coupling predetermined contacts of the top surface and/or contacts of the bottom surface together. For example, conductors 322, 332, 338, 342, and 348 are shown in FIG. 3a coupling contacts of the top surface and contacts of the bottom surface together. A solder mask layer 320 is then applied over a surface of the substrate, e.g., the top surface of the substrate 302. As shown in FIG. 3b, the solder mask is then etched to create openings for solder bumps of an IC die and discrete components such as capacitors and resistors. The IC die 301 and the discrete components 305 and 306 are positioned on the substrate 302, as shown in FIG. 3c. The IC die 301 and discrete components 305 and 306 may be attached to corresponding pads of the substrate 302 by a way of soldering or reflow process. The reflowing or the soldering process is a process of adhering or attaching, for example, an IC die to a substrate or an IC to a PCB by away of applying high heat utilizing special equipment, such as a conveyorized oven or solder station. Other methods of attaching an IC die and discrete components to a substrate are well known to persons skilled in the art.

FIG. 3d illustrates a magnified view of a process step in manufacturing the IC package according to an embodiment of the present invention. FIG. 3d shows the component 305, a portion of the IC die 301, and other layers, where additional processes are implemented, such as applying adhesive layer 309. In an example, an underfill layer 350 and bonding agent for attaching a lid to the substrate may be applied. The bonding agent mentioned above may include the adhesive layer 309 applied to the top side of the IC die 301. Additional process steps may include applying a first epoxy and a second epoxy material to the component 305. For example, the first epoxy material 310 may be applied to the component 305, where the first epoxy is an underfill to protect a portion of component 305. The portion of component 305 that the first epoxy may cover or seal may be the underside of component 305 includes inner portion of solder bumps 312, and a portion of terminals 313. The first epoxy may protect the areas described above from exposure to solutions, such as solvents and moisture. The first epoxy material may be applied by way of jetting or underfill jetting according to an embodiment of the present invention. The underfill jetting is a process that may be used to dispense epoxies and/or bonding agents, such as bonding agent 350 (of FIG. 3d) to protect, for example, the IC solder bumps 351. In an embodiment of the present invention, the first epoxy 310 may be applied by a way of jetting to seal and protect the underside of the component 305.

The underfill jetting process offers a high degree of control and faster dispensing (e.g., less time is needed for dispensing materials) over other methods. Other underfill dispensing methods may include the use of an auger or linear positive displacement pump with a needle to apply the underfill around an IC die, such as a flip chip die. Also, jetting offers the ability to make patterns with materials, such as epoxies, and in some cases can be directed at an angle to dispense epoxies that are not possible with conventional methods. The underfill jetting process has been used mainly on IC dice and system level dispensing of epoxies including different viscosities. In some embodiments, the underfill jetting process may be used in applying epoxies, such as the first epoxy 310. Note that other techniques for applying an underfill layer to a discrete component may be used in accordance with embodiments of the present invention.

In an example, the first epoxy 310 may have a viscosity that allows the epoxy to flow under the component 305 and seal the underside or inner side portion of the component 305 including terminals 313 and the solder bumps 312. The underfill jetting method may be used to dispense a second epoxy 311 to seal the outer or top side of the component 305. The second epoxy 311 may have different properties than the first epoxy, for example, viscosity and/or thermal conductivity. For instance, the second epoxy may be more viscous than the first epoxy material (e.g., the first epoxy may be more fluid than the second epoxy). In another example, the first epoxy and the second epoxy may have similar properties, such as both epoxies may be thermally conductive. In general, the first epoxy and the second epoxy may be any available materials that are utilized for various packaging processes. For example, the first epoxy may be underfill with fine filler size material, and the second epoxy material may be high viscosity thermoset epoxy material.

FIG. 3e illustrates an IC package including the IC die 301, the substrate 302, and discrete components 305 and 306. The IC die 301 and the discrete components 305 and 306 may be coupled to the substrate 302 and enclosed by a lid 315. An adhesive layer 317 may be applied on the substrate 302 for attaching a foot portion of the lid 315 to the substrate 302. Alternatively, solder or some other suitable bonding agent may be used to attach the lid 315 to the substrate 302. Finally, the lid 315 is attached to the bonding agent 317 and the solder balls 318 are attached to contact pads on the bottom side of the substrate 302, as shown in FIG. 3e. In an example of coupling the discrete components 305 and 306 may include coupling terminals of the discrete components to power terminals and signal terminals of the IC die 301. For instance, the discrete component 305 may be a decoupling capacitor having a terminal coupled to a power terminal (power solder bump) of the IC die for the purpose of noise decoupling. Discrete component 306 may be a resistor having a terminal coupled to a signal terminal (signal solder pump) of the IC die for the purpose of signal termination.

FIGS. 3a-3e illustrates a method of sealing terminals and solder bumps of components placed on a substrate. The method described in FIGS. 3a-3e includes dispensing a first epoxy and a second epoxy, where the first epoxy and the second epoxy have at least one different property and may encase the discrete component including terminals of the discrete component and solder bumps. Encasing the components with the epoxies described above may improve the quality, reliability, and performance of the IC package. In an example, the IC package may be used in a harsh environment (e.g., military, aerospace, etc.), where the harsh environment may include elevated temperature and/or moisture exposure. Utilizing thermally conductive epoxies in IC packages exposed to harsh environments may improve thermal performance of the IC die. The thermally conductive epoxies may lower the thermal resistance of the IC package, thereby enabling heat dissipation of the IC die more efficient.

Figure 4:
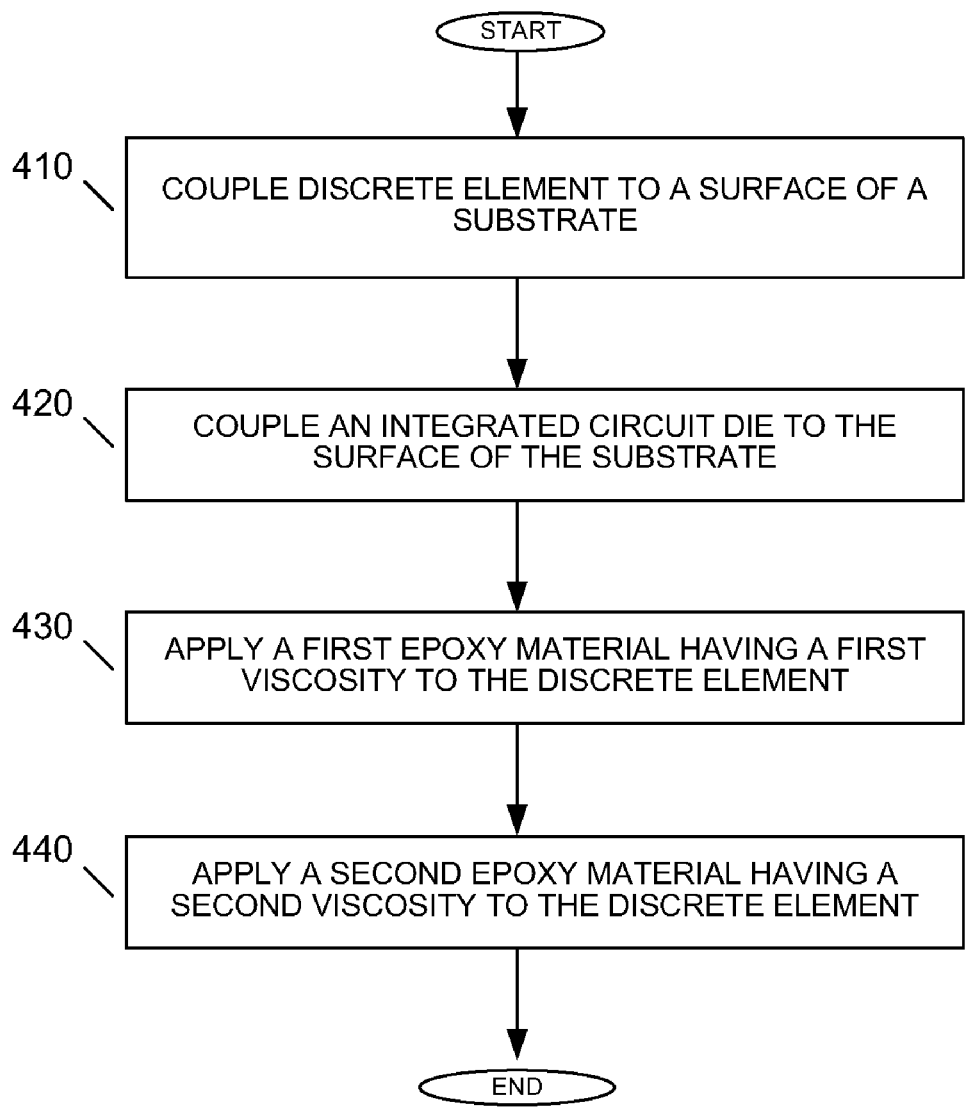
FIG. 4 is a flow chart illustrating a method of implementing a discrete element in an integrated circuit package according to an embodiment the present invention.

FIG. 4 is a flow chart illustrating a method of implementing a discrete element in an integrated circuit package according to an embodiment of the present invention. For example, the method of FIG. 4 may be used to create the integrated circuit package of FIGS. 3a-3e. According to one aspect of the method, the design of the integrated circuit package may include providing of an IC die and at least one discrete element, such as a capacitor or a resistor, a substrate, and a lid for the assembly process of an IC package. The method of FIG. 4 starts by coupling the discrete element to a surface of the substrate at step 410, and coupling the IC die to the surface of the substrate at step 420, where the IC die and the discrete component/element may be on the same side of the substrate. In an example, the discrete element may be placed or positioned in close proximity of an edge of the IC die. In an example, the discrete element may be a decoupling capacitor positioned in close proximity to a power supply terminals of a flip chip die. The decoupling capacitor may decouple noise of a power supply thereby improving the performance of the IC.

At step 430, a first epoxy may be applied or dispensed to the discrete element, where the first epoxy has a first viscosity. In an example, the first epoxy may be an underfill applied to the discrete element by a way of jetting. The first epoxy may seal the underside of the discrete element including inner portion of terminals of the discrete element. At step 440, a second epoxy may be applied to the discrete element, where the second epoxy may have a second viscosity. For instance, the viscosity of the second epoxy may be more viscous than the viscosity of the first epoxy. The second epoxy may seal an outer portion of the discrete component including the terminals of the discrete element. In an embodiment of the present invention, the first and the second epoxies may seal the discrete element from exposure to solutions, such as solvents and moisture. For example, an IC package may include discrete elements (e.g., capacitors, resistors, etc.) attached to a substrate, where the discrete elements are not sealed with epoxies. Exposing such IC package to solutions (e.g., water, corrosive solvents, etc.), relief openings of the substrate may allow the solutions to penetrate the cavity of the IC package and exposing terminals of the discrete components to the solutions. The exposure to solutions may degrade performance of the IC, if the terminals of the discrete components are affected by solutions (e.g., increased contact resistance). In some cases, prolonged exposure to solvents may cause the terminals of the discrete elements to electrically decouple from the substrate of the IC package. In such events, the IC may fail to function properly.

In some instances, a lid may be attached to the substrate enclosing the IC die and the discrete element forming the IC package. For example, an adhesive may be applied to the perimeter of the substrate allowing the lid to adhere to the substrate and sealing the edges. Other methods of attaching a lid to a substrate, such as soldering, may be utilized to form the IC package and in some instances a lid may not be included. The methods steps described above may be performed in any order.

The methods described above provide a number of advantages over conventional designs. For example, the positioning of components such as decoupling capacitors in close proximity to the IC die may provide better electrical performance due to shorter conductive paths between the decoupling capacitors and the power/ground bumps of the IC die. The methods also provide an improved packaging efficiency by reducing requirements of placing components, such as capacitors on the PCB of the system, thereby reducing area requirements for the system while improving the overall performance of the system.

It can therefore be appreciated that new methods of implementing a capacitor on an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

Further, epoxies and other components other than those described herein can be used to implement the invention. In an example, a number of well known epoxy materials may be used in the process of jetting the underfill. Moreover, some components are shown in certain location of the IC package, while others may be distributed according to the design specification. In each instance the methods of applying epoxies with different viscosities to discrete component of an IC package may establish some desired quality and reliability to the IC package.

What is claimed is:

1. An integrated circuit package comprising:
a substrate, wherein the substrate includes a plurality of relief openings;
an integrated circuit die coupled to the substrate;
a plurality of discrete components coupled to the substrate;
a first epoxy material;
a second epoxy material different from the first epoxy material; and
a lid coupled to the substrate, wherein the lid encloses the integrated circuit die and the plurality of discrete components,
wherein:
the first epoxy material underfills each of the plurality of discrete components, and the second epoxy material is formed in a plurality of second-epoxy structures, and each of the second-epoxy structures seals an outer portion of a respective one of the plurality of discrete components; and
a first discrete component of the plurality of discrete components has at least one terminal coupled to a signal terminal of the integrated circuit die.

2. The integrated circuit package of claim 1, wherein the first epoxy material is more fluid than the second epoxy material.

3. The integrated circuit package of claim 2, wherein the first epoxy material is different from the second epoxy material.

4. The integrated circuit package of claim 3, wherein the second epoxy material is a thermoset.

5. The integrated circuit package of claim 1, wherein at least one of the first epoxy material and the second epoxy material are thermally conductive.

6. The integrated circuit package of claim 1, wherein
a second discrete component of the plurality of discrete components has at least one terminal coupled with a power terminal of the integrated circuit die.

7. A method of implementing a discrete element in an integrated circuit package, the method comprising:
coupling a plurality of discrete elements to a surface of a substrate;
coupling an integrated circuit die to the surface of the substrate;
coupling a terminal of a first discrete element of the plurality of discrete elements to a signal terminal of the integrated circuit die;
applying a first epoxy material as underfill of the plurality of discrete elements;

applying a second epoxy material different from the first epoxy material to outer portions of the plurality of discrete elements, the second epoxy material forming a plurality of second-epoxy structures that seal the outer portions of the plurality of discrete elements; and
coupling a lid to the substrate, wherein the lid encloses the integrated circuit die and the plurality of discrete elements, and wherein the substrate includes a plurality of relief openings.

8. The method of claim 7, wherein the step of applying the first epoxy material comprises sealing underside of the discrete element, wherein the underside of the discrete element comprises inner portions of terminals of the discrete element.

9. The method of claim 7, further comprising attaching a lid to the substrate, wherein the lid encloses the integrated circuit die and the discrete element.

10. The method of claim 7, wherein the first epoxy material is more fluid than the second epoxy material, and wherein the first epoxy material is underfill.

11. The method of claim 7, wherein the step of applying the first epoxy material comprises applying the first epoxy material by a way of jetting.

12. The method of claim 7, wherein at least one of the first epoxy material and the second epoxy material are thermally conductive.

13. A method of implementing an integrated circuit (IC) package having a plurality of discrete elements, the method comprising:
positioning a flip chip die having a plurality of solder bumps on a surface of a substrate, wherein the substrate includes a plurality of relief openings;
positioning the plurality of discrete elements on the surface of the substrate;
coupling a terminal of a first discrete element of the plurality of discrete elements to a signal terminal of the integrated circuit die;
reflowing the plurality of solder bumps of the flip chip die and terminals of the plurality of discrete elements;
applying a first epoxy material as underfill of the plurality of discrete elements;
applying a second epoxy material different from the first epoxy material to outer portions of the plurality of discrete elements, the second epoxy material forming a plurality of second-epoxy structures that seal the outer portions of the plurality of discrete elements; and
coupling a lid to the substrate, wherein the lid encloses the integrated circuit die and the discrete elements.

14. The method of claim 13, wherein the step of positioning the plurality of discrete elements comprises positioning a first portion of the plurality of discrete elements in close proximity to power solder bumps of the flip chip die.

15. The method of claim 14, wherein the step of positioning the plurality of discrete elements comprises positioning a second portion of the plurality of discrete elements in close proximity to signal solder bumps of the flip chip die.

16. The method of claim 13, further comprising exposing the IC package to a harsh environment comprising moisture.

17. The method of claim 13, further comprising applying the first epoxy material by a way of jetting, wherein the first epoxy material is an underfill.

18. The method of claim 13, wherein the second epoxy material is a thermoset.

* * * * *